United States Patent
Berenbaum et al.

(10) Patent No.: US 7,369,432 B2
(45) Date of Patent: May 6, 2008

(54) METHOD FOR IMPLEMENTING A COUNTER IN A MEMORY WITH INCREASED MEMORY EFFICIENCY

(75) Inventors: Alan D. Berenbaum, New York, NY (US); Richard E. Wahler, St. James, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 268 days.

(21) Appl. No.: 11/355,685

(22) Filed: Feb. 16, 2006

(65) Prior Publication Data

US 2007/0189082 A1    Aug. 16, 2007

(51) Int. Cl.
*G11C 11/34* (2006.01)
(52) U.S. Cl. .......................... 365/185.01; 365/185.29; 365/185.33; 365/235; 365/236; 365/238.5; 711/103; 713/502; 377/110
(58) Field of Classification Search ........... 365/185.29, 365/185.33, 236, 238.5; 711/103; 713/502; 377/110
See application file for complete search history.

(56) References Cited

U.S. PATENT DOCUMENTS

| | | | | |
|---|---|---|---|---|
| 4,638,457 A | * | 1/1987 | Schrenk | ................. 365/189.01 |
| 4,947,410 A | * | 8/1990 | Lippmann et al. | ............ 377/26 |
| 6,084,935 A | * | 7/2000 | Mather | ......................... 377/33 |
| 6,160,739 A | * | 12/2000 | Wong | ..................... 365/185.29 |
| 6,424,574 B1 | * | 7/2002 | Chou | ..................... 365/185.29 |
| 6,836,853 B1 | | 12/2004 | Dover et al. | |
| 7,065,607 B2 | | 6/2006 | England et al. | |
| 2006/0133560 A1 | | 6/2006 | Takagi | |
| 2006/0140331 A1 | | 6/2006 | Du | |
| 2007/0150644 A1 | * | 6/2007 | Pinto et al. | .................. 711/103 |

* cited by examiner

*Primary Examiner*—Anh Phung
*Assistant Examiner*—Eric Wendler
(74) *Attorney, Agent, or Firm*—Meyertons Hood Kivlin Kowert & Goetzel, P.C.; Jeffrey C. Hood (57) ABSTRACT

A method for implementing a counter in memory, e.g., non-volatile memory such as flash memory. A first number of first binary values indicating a first portion of a current number of the counter in a binary field may be stored in a portion of memory. Storing the first number may also include increasing the number of first binary values in the binary field. Additionally, a second number indicating a second portion of the current number of the counter may be stored in another portion of memory. The second number may specify the number of times the first binary values has comprised the entirety of the binary field. Thus, the first number and second number may specify the current number of the counter. Storing the first and second number may be performed a plurality of times to implement a counting function of the counter.

20 Claims, 5 Drawing Sheets

Initialization: Flash erase to all 1's

| 1023 | 1000 | 999 | 0 |
|---|---|---|---|
| 111 ... | 111 | 111 ... | 111 |

Step 1: Set counter to 1,000
Write value: '0000...1111....1111' (the value 1 in bits 1000-1023, 1's in all other bits)

| | 1000 | 999 | 0 |
|---|---|---|---|
| 000 ... | 001 | 111 ... | 111 |

Step 2: Set counter to 1,001
Write value: '1111...1111....1110' (0 in bit 0, 1's in all other bits)

| | 1000 | 999 | 0 |
|---|---|---|---|
| 000 ... | 001 | 111 ... | 110 |

Step 3: Set counter to 1,002
Write value: '1111...1111....1101' (0 in bit 1, 1's in all other bits)

| | 1000 | 999 | 0 |
|---|---|---|---|
| 000 ... | 001 | 111 ... | 100 |

Step 4: Set counter to 1,003
Write value: '1111...1111....1011' (0 in bit 2, 1's in all other bits)

| | 1000 | 999 | 0 |
|---|---|---|---|
| 000 ... | 001 | 111 ... | 000 |

...

Step 1000: Set counter to 1,999
Write value: '1111...1011....1111' (0 in bit 998, 1's in all other bits)

| | 1000 | 999 | 0 |
|---|---|---|---|
| 000 ... | 001 | 100 ... | 000 |

Step 1001: Set counter to 2,000
Flash to all 1's, then Write value '2' in bits 1000-1023, 1's in all other bits

| | 1000 | 999 | 0 |
|---|---|---|---|
| 000 ... | 010 | 111 ... | 111 |

*Figure 5*

METHOD FOR IMPLEMENTING A COUNTER IN A MEMORY WITH INCREASED MEMORY EFFICIENCY

FIELD OF THE INVENTION

This invention relates generally to the field of counters and, more particularly, to counters utilized in digital memory.

DESCRIPTION OF THE RELATED ART

In recent years, the electronics marketplace has seen a proliferation of appliances and personal electronics devices that use solid-state memory. For example, traditional film cameras have been losing market share to digital cameras capable of recording images that may be directly downloaded to and stored on personal computers (PCs). Other devices that typically use solid-state memory include personal digital assistants (PDAs), pocket PCs, video game consoles, and MP3 players (e.g., iPods), among others.

Widely used solid-state memory devices often include flash memory chips configured on a small removable card, and are commonly referred to as flash memory cards. The majority of flash memory cards currently on the market typically are one of four different types: Compact Flash, Multi Media Card (MMC) and the related Secure Digital Card (SD); SmartMedia, and Memory Stick. Most digital cameras, for example, use Compact Flash cards to record images. Many PDA models use Memory Stick cards to hold data. Some MP3 players store music files on Smart Media cards. Generally, data saved by PDAs and other handheld devices using flash memory cards are also transferred or downloaded to a PC. It should also be noted that flash memory is widely implemented in embedded systems, such as Systems on Chips (SoCs), i.e., integrated circuits with processors, memories, peripherals, and interconnects. Additionally, these embedded systems may also be implemented in devices such as those handheld devices enumerated above. In the present application, the term "flash memory" is intended to have the full breadth of its ordinary meaning, which generally encompasses various types of non-volatile solid-state memory.

In general, flash memory is implemented in cells, each including two transistors separated by a thin oxide layer. One of the transistors is known as a floating gate, and the other is known as the control gate. The cell represents a '0' when negative charge is stored in the floating gate, and a '1' when current can pass through the gates, i.e., when no charge is present in the floating gate. The cell may be programmed to a '0' when an electron tunnels through the oxide layer while a charge is applied to the floating gate. The cell may also be erased to a value of '1' by application of an electric field.

Generally, data in flash memory devices may be erased, i.e., each bit set to a '1', in units of blocks, and flash memory devices may be programmed, i.e., written, in units of pages, e.g., addressable bytes. Blocks typically designate a minimum Erasable Unit (EU), and include a plurality of pages, which serve as a minimum Read/Write Unit (RWU). Subsequent to erasing the block, bits may be programmed page at a time; however, a block (including multiple pages) is typically erased in its entirety before data can be updated (re-programmed). These erase and program cycles, i.e., write cycles, cause wear on the bits, i.e., flash cells, being modified. In general, the lifetime of an individual bit may be measured in total write/erase cycles. Thus, in systems including flash memory, efficient methods for memory use, e.g., limiting the number of write cycles, provides a longer lifetime for the memory. One prior art method spreads the total number of write cycles evenly over the entire memory, thus increasing the lifetime of the bits that may have otherwise been overused. However, this method does not limit the total number of write cycles executed on the memory.

Many systems and devices, such as those enumerated above regarding flash memory, and others, implement counters in various memory types. Counters often require high numbers of write cycles, e.g., over 10,000,000. For example, the Trusted Computing Group (TCG), an industry group that defines open standards for trusted computing, requires that the Trusted Platform Module (TPM), an example of an SoC, have a counter that can reach 32,000,000.

The TPM requirement presents a problem in systems where the counter is implemented in flash memory because of the lifetimes of flash cells described above. In some circumstances, to achieve the TPM performance requirement using more traditional replication methods (e.g., copying the counter to a new position), the counter may require as many as 3,000 memory locations, each used 10,000 times. Such memory usage is problematic with respect to write cycle and chip efficiency, in that such prodigious numbers of write cycles may limit the effective lifetime of the memory, and the substantial memory required may be impractical and/or expensive. One prior art uses more robust flash memory with increased write-cycle lifetimes to overcome this issue; however, the more robust flash memory can be inordinately expensive.

Thus, an implementation of a counter in memory with increased memory efficiency may be desirable.

SUMMARY OF THE INVENTION

Various embodiments of a system and method are presented for implementing a counter in memory. The method may be implemented in a non-volatile memory, e.g., flash memory. However, other suitable memories are contemplated other than flash memory. The counter may be implemented in a system comprising circuit logic and memory, such as a computer, a PDA, a flash device, a digital music device (such as Apple Computer, Inc.'s iPod), a digital camera, and other suitable devices.

As described above, flash memory may be operated through a limited number of functions. The memory may be erased a block at a time, where a block may be a defined portion of the memory comprised of bits. In the specific case of flash memory, the erase function may set each of the bits within the block to a '1'. Each of the bits may be programmed to a '0', e.g., page at a time, e.g., via byte wide pages, as desired. Note that, because values of '1' may only be achieved by erasing (blocks of) the memory, no wear occurs on an individual bit when a '1' is written. In other words, writing a '1' to a bit, whether previously '0' or '1', does not affect the value of the bit or cause wear on the cell (the bit stays at its previous value). However, programming a '0' may change the value of a '1' to a '0', and may cause wear on the flash cell regardless of its previous value, e.g., '0' or '1'. As noted above, a '0' may only be changed back to a '1' through the erase of the entire memory block.

The method may include initializing portions of memory to a desired state. One of the portions may be initialized to an erased state, e.g., each of the bits inside of the portion may be set to '1's. This particular erased state may be especially useful in those embodiments utilizing flash memory. Alternatively, or in addition, one of the portions may be initialized to an erased state where each of the bits inside of the portion may be '0's. In some embodiments two portions of memory may be implemented and a first portion may be initialized to an erased state. However, desired states are not limited to such erased states, in fact, other states are envisioned.

A first number of first binary values indicating a first portion of a current number of a counter in a binary field may be stored in a portion of a memory. For example, when the first portion is initialized to an erased state comprising a field of '1's, a first number may be stored by programming the first number of bits in the field to a '0'. More specifically, a first count may be stored by programming one of the bits in the erased field to a '0'. Thus, the number of '0's, in this case 1, in the binary field (in this case, largely comprised of '1's), indicates an increment of the counter of one unit. As used herein, a number of first binary values in a binary field may be referred to as a tally. In examples such as those described above, storing the first number may also include increasing the number of first binary values in the binary field.

A second number indicating a second portion of the current number of the counter may be stored in a second portion of the memory. The second number may specify the number of times the first number of first binary values has comprised an entirety of the binary field, i.e., the number of times the first number has "rolled over". In the example described hereinabove where the first number indicates the number of '0's in a binary field, the second number may specify the number of times the entire field has been programmed to '0's. Storing the second number may also include determining if the number of first binary values comprises an entirety of the binary field, and, upon determining that the first binary values has comprised an entirety of the binary field, updating the second number. Additionally, storing the second number may further include setting each member of the binary field to a second binary value in response to said updating. In the example where the first number indicates the number of '0's in a binary field, this setting may be performed by changing each of the '0's in the binary field to '1's using an erase function.

The second number may be a binary number, i.e., base 2. Alternatively, the second number may be specified as a number of one of the first binary values and second binary values in a second binary field. Said another way, the second number may be a number of binary values in a binary field similar to the tally method described above. The binary values may be the same as those in the tally; alternatively, the binary values may also be reversed, e.g., if the first number is the number of '0's in a field of '1's, the second number may be the number of '1's in a field of '0's.

Thus, the first and second numbers may specify the current number of the counter. As described in numerous of the examples hereinabove, storing the first number and the second number a plurality of times may implement a counting function of the counter. Additionally, the described implementation of a counter in memory may reduce the number of operations to the memory, increase the lifetime of the memory, and operate under the performance requirements of a TPM counter.

Further embodiments may include additional portions of memory with associated additional numbers which may specify and implement a counter in memory. In some embodiments, one or more of the first number, the second number, and the additional numbers may specify the current number of the counter. Furthermore, storing these additional numbers in additional portions of memory a plurality of times may operate to implement a counting function of the counter.

BRIEF DESCRIPTIONS OF THE DRAWING

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Figure 1:
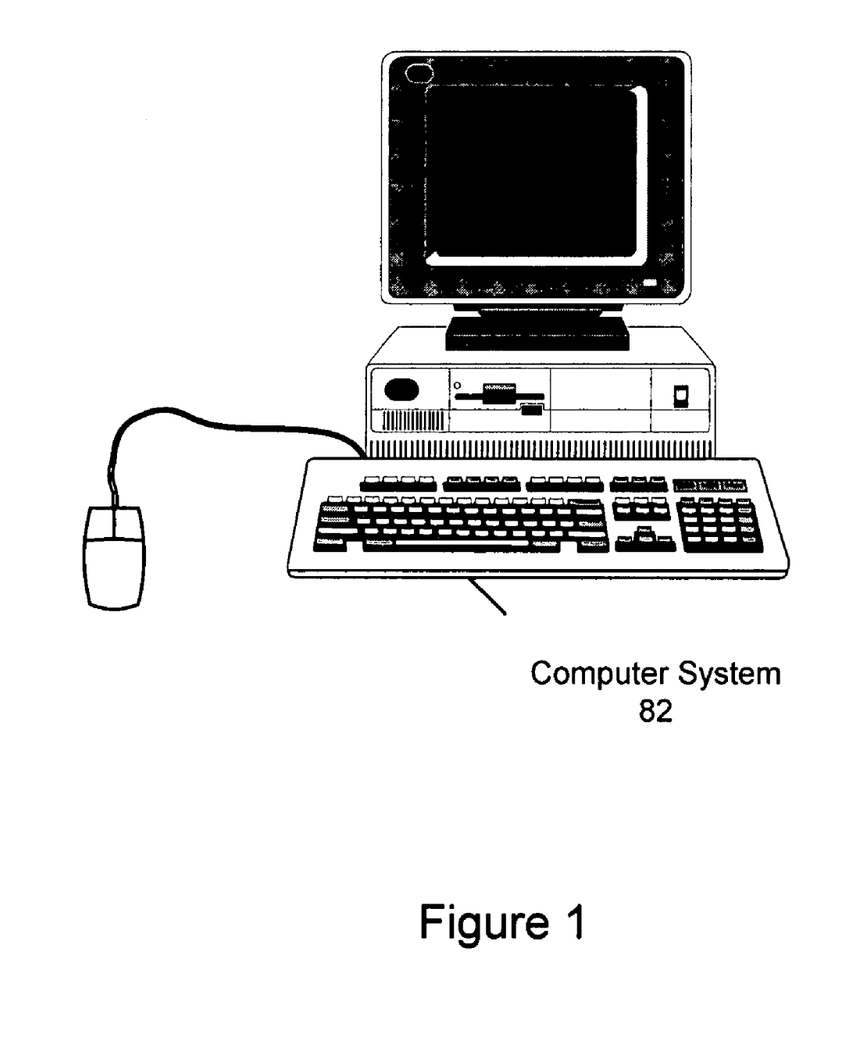
FIG. 1 illustrates a computer system suitable for implementing various embodiments of the present invention.

FIG. 1—Computer System

FIG. 1 illustrates a computer system 82 suitable for implementing some embodiments of the present invention. However, it should be noted that various other systems are envisioned, including devices (e.g., handheld devices, e.g., digital music players, digital cameras, etc.), embedded systems (e.g., systems on chips (SoCs), cellular telephones, copiers, calculators, engine controllers, measurement analyzers, programmable logic controllers, videogame consoles, etc.), and other suitable systems. Some embodiments of a method for implementing and executing a counter or other memory intensive function in memory are described below.

The computer system 82 may include a memory medium(s) on which one or more computer programs or software components according to one embodiment of the present invention may be stored. The memory medium may also store operating system software, as well as other software for operation of the computer system.

The computer system 82 may include a non-volatile memory that implements a counter or other memory intensive functions. The computer system 82 may also comprise logic circuitry for implementing the counter or other functions in the memory. Alternatively, the non-volatile memory may be controlled by software. In this instance, the computer system 82 may comprise one or more display devices, one or more input devices, and one or more methods for inputting data. As shown, the computer system 82 comprises a monitor as a display device, a keyboard and mouse as user-input devices, and a disc drive for data input. However, computer system 82 may not be limited by these elements, and in fact, further elements are envisioned for the system. For example, the display device may comprise one or more of: the monitor, an LCD, a touch-screen display device, and any other suitable device for displaying information from the computer system 82. User-input devices may also comprise one or more of: the mouse, the keyboard, a joystick, a touch-screen device (e.g., a drawing pad), a microphone with corresponding software usable for voice-activation, and other means for user-input. Data input may comprise one or more of: the disc drive, a CD drive, a DVD drive, an external drive (e.g., USB drives, IDE drives, SCSI drives, etc.), a network port for connecting to other systems (e.g., an Ethernet port, serial port, parallel port, USB port, etc.), and further data input methods.

Figure 2:
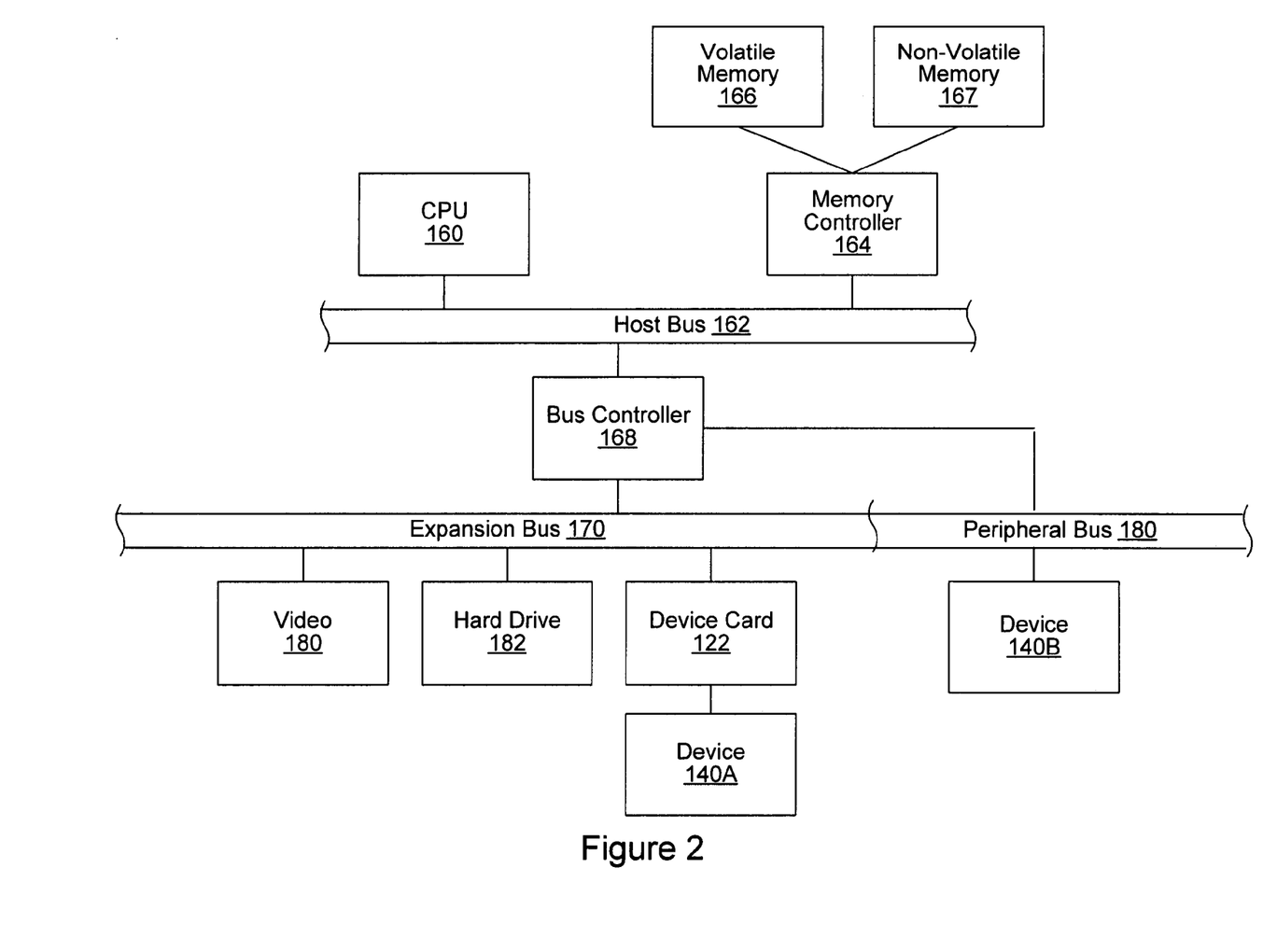
FIG. 2 is a high-level block diagram of an exemplary system which may execute or utilize programs, according to some embodiments.

FIG. 2—Computer System Block Diagram

FIG. 2 is a block diagram representing one embodiment of the computer system 82. It should be noted that any type of computer system configuration or architecture can be used as desired, and FIG. 2 illustrates a representative PC embodiment. It is also noted that the computer system may be a general-purpose computer system, a computer implemented on a card installed in a chassis, or other types of embodiments. Elements of a computer not necessary to understand the present description have been omitted for simplicity. Furthermore, in various embodiments, additional elements other than those shown in FIG. 2 are envisioned, and elements within FIG. 2 may be rearranged or omitted.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. Volatile memory 166, typically comprising Random Access Memory (RAM), and non-volatile memory 167, e.g., including flash memory, may be coupled to the host bus 162 by means of memory controller 164. Memories 166 and 167 may also store operating system software, as well as other software for operation of the computer system. In various embodiments, the computer system may comprise only one, or one or more of the volatile and non-volatile memories connected to memory controller 164. In some embodiments of the method, program instructions for implementing a counter may reside in volatile memory 166 and/or non-volatile memory 167. The program instructions may be executed by CPU 160 or by any other hardware with appropriate capabilities present within, or coupled to, the computer system 82.

The host bus 162 may be coupled to an expansion or input/output bus 170 by means of a bus controller 168 or bus bridge logic. The peripheral bus 180 may comprise a USB, serial, parallel, FireWire, or other bus and/or communication method that may connect devices 140B to the computer system 82. The expansion bus 170 may be the PCI (Peripheral Component Interconnect) expansion bus, although other bus types may be used. The expansion bus 170 includes slots for various devices such as those described above. The computer 82 further comprises a video display subsystem 180 and hard drive 182 coupled to the expansion bus 170. Additionally, device card 122 may allow devices 140A to connect to the computer system.

Figure 3:
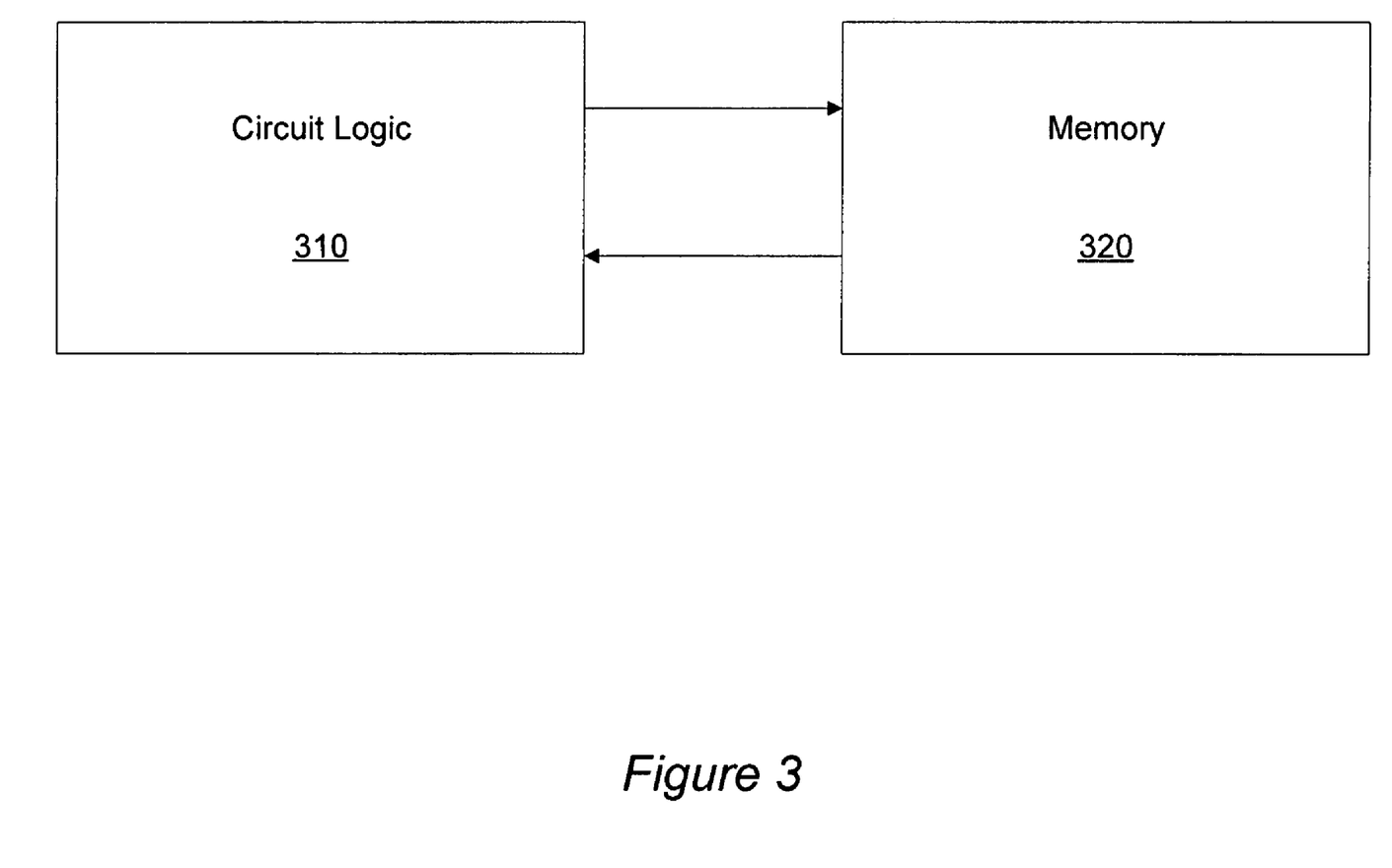
FIG. 3 is a block diagram illustrating one embodiment of an exemplary system which may execute or utilize program instructions.

The computer system 82, and devices 140A and/or 140B may include logic circuitry 310 and memory 320 which may implement a counter, e.g., a persistent counter, as illustrated in FIG. 3. Example devices may include digital cameras, iPods, PDAs, other PCs, other flash devices, etc. Note that devices 140A and 140B may also be connected to the computer system in various methods other than those illustrated in FIG. 2. For example, devices 140A and 140B may be comprised in an expansion card coupled to the expansion bus 170, or they may be coupled to the computer via a transmission medium.

As indicated above, logic circuitry may comprise any type of controller, e.g., a processor or other programmable controller, such as, for example, a programmable hardware element, e.g., an FPGA (Field-Programmable Gate Array). Memory 320 may comprise one or more of volatile memory (e.g., RAM), and non-volatile memory (e.g., flash memory). Circuit logic 310 and memory 320 may be implemented as an embedded processor with an associated embedded memory within a system. In some embodiments, the system of FIG. 3 may be connected to the computer system 82 as any of devices 140A, 140B, and further connected devices not shown in FIG. 2.

In other embodiments, the circuit logic 310 and memory 320 may be implemented in stand-alone systems. In one embodiment, FIG. 3 may represent a state-machine system that implements a counter to represent different states. The state-machine system may not include a programmable processor. Thus, in preferred embodiments, FIGS. 1, 2, and 3 illustrate exemplary systems for implementing a counter in memory. However, the systems and methods described herein may also efficiently implement other memory intensive processes, e.g., those that involve updating numbers frequently. For example, some systems or devices may update stock information, game scores, e.g., football, basketball, etc., weather information, or other desirable information. Note that the preferred embodiments regarding counters in memory disclosed herein may apply to other functions or processes as described above.

Counters in Memory

Implementation of a counter in memory is described hereinbelow. Preferably, the counter is implemented in systems exemplified in FIGS. 1, 2, and 3. In some embodiments, the counter is implemented in non-volatile memory, e.g., flash memory. However, note that other suitable memories types are contemplated other than flash memory.

As described hereinabove, flash memory may be operated through a limited number of functions. The memory may be erased a block at a time, where a block may be a defined portion of the memory comprised of bits. In the specific case of flash memory, the erase function may set each of the bits within the block to a '1'. Each of the bits may be programmed to a '0' in pages of memory, e.g., byte wide pages, as desired. Note that no wear occurs on the individual bit when the memory is set to a '1'. Additionally, programming a '1' has no effect on the value of the bit being programmed. For example, in programming a byte wide page of memory from '11111111' to '10111110', two program cycles may be performed. In the first cycle, the page may be written with '10111111'; in the second cycle, the page may be written with '11111110', resulting in the desired bit sequence of the byte wide portion of memory of '10111110'. Thus, programming a '1' to a bit, whether previously '0' or '1', does not affect the value of the bit or cause wear on the cell. However, programming a '0' may change the value of a '1' to a '0', and may cause wear on the flash cell regardless of its previous value, e.g., '0' or '1'. Additionally, a '0' may only be changed back to a '1' through the erase of the entire memory block.

As described above, counters often require high numbers of write cycles, e.g., over 32,000,000 for a TPM. In implementing a counter in memory, it is therefore desirable to use the memory efficiently. For example, in embodiments using flash memory, limiting the number of write cycles performed on the memory results in a reduction in the wear of the memory, both in terms of the memory as a whole and particular blocks or bits of the memory.

In standard NOR flash memory, 10,000 to 100,000 write cycles may be executed in the lifetime of a particular bit before loss of performance; standard NAND flash memory may have a lifetime as long as 1,000,000 write cycles. Thus, as indicated above, lowering the total number of write cycles in flash memory increases the lifetime of the memory. Lowering the number of write cycles utilized in a process may also have additional benefits, such as, for example, increasing the speed of the process. The techniques described herein may be applied to other types of memory in addition to flash memory, such as those enumerated hereinabove.

Figure 4:
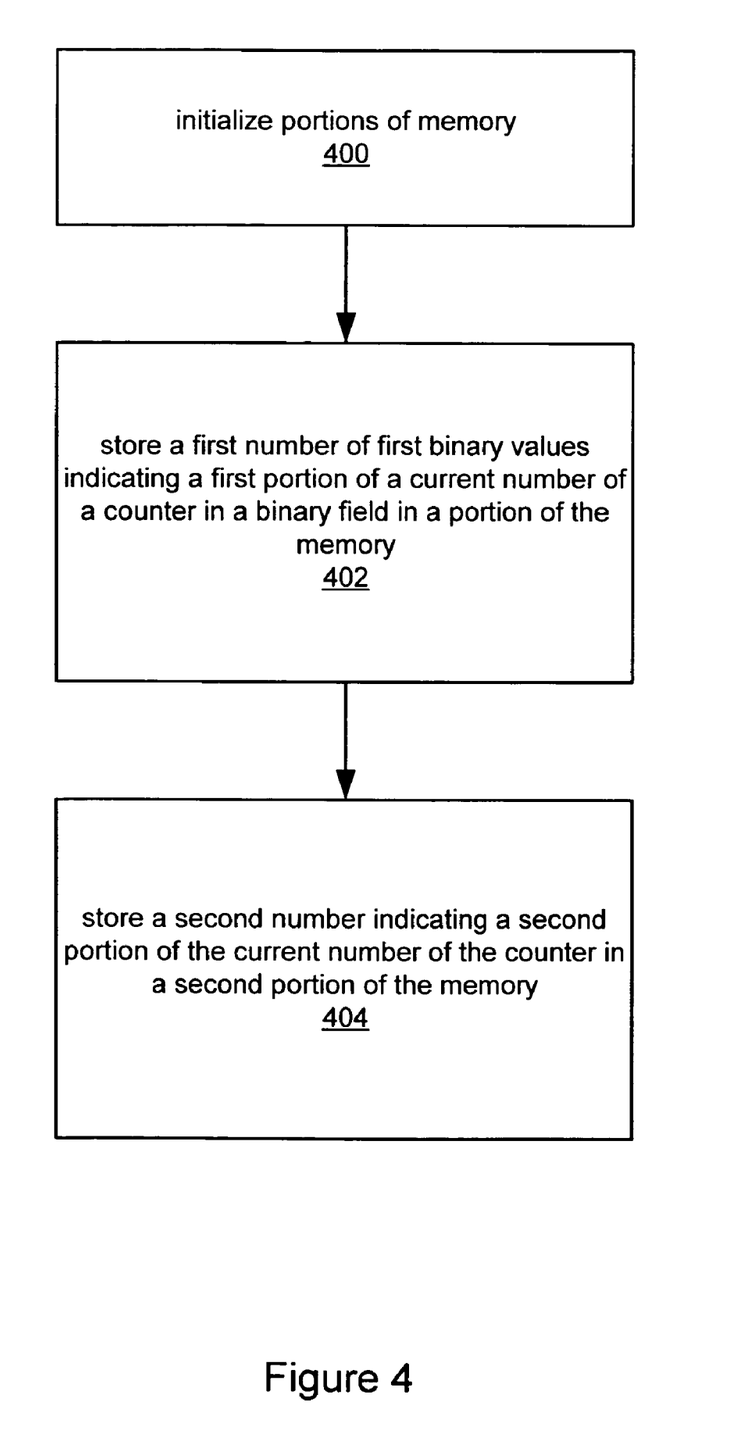
FIG. 4 is a flowchart diagram illustrating one embodiment of a method for implementing a counter in digital memory.

FIG. 4 illustrates a method for implementing a counter in memory according to some embodiments. In various embodiments, some of the steps shown may be performed concurrently, performed in a different order than shown, or omitted. Additional steps may also be performed as desired.

In 400, the method may include an initialization of one or more portions of memory to a desired state. In some embodiments, one of the portions may be initialized to an erased state, e.g., each of the bits inside of the portion may be '1's. This particular erased state may be especially useful in those embodiments utilizing flash memory. In some embodiments, others of the portions of memory may also be initialized to such an erased state. In one embodiment, one of the portions may be initialized to an erased state where each of the bits inside of the portion may be '0's. However, desired states are not limited to such erased states, and in fact, other desired states are envisioned. In some embodiments illustrated by the method of FIG. 4, two portions of memory may be initialized and a first portion may be initialized to an erased state.

Figure 5:
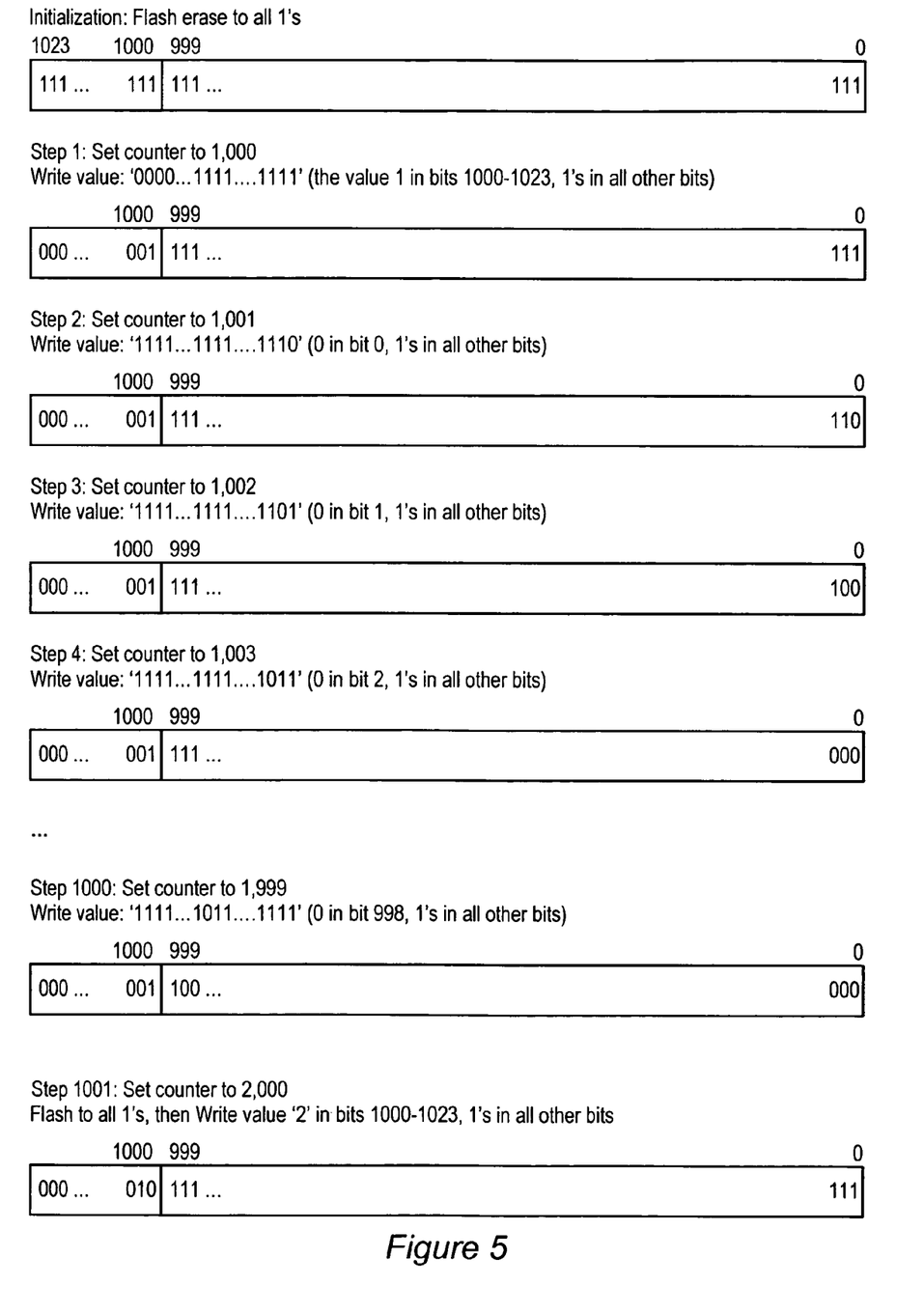
FIG. 5 illustrates an exemplary series of states of a memory implementing a counter, according to one embodiment.

In 402, a first number of first binary values indicating a first portion of a current number of a counter in a binary field may be stored in a portion of a memory. In some embodiments, the circuit logic illustrated in FIG. 3 may perform the storing of the first number. For example, when the first portion is initialized to an erased state comprising a field of '1's, a first number may be stored by programming the first number of bits in the field to a '0'. More specifically, a first count may be stored by programming one of the bits in the erased field to a '0'. Thus, the number of '0's, in this case 1, in the field of '1's, indicates an increment of the counter of one unit. In this embodiment, counting from 0 to 5 in five bits would be implemented as '11111', '11110', '11100', '11000', '10000', '00000'. FIG. 5, described below, illustrates such an example in a larger context. As stated above, a number of binary values in a binary field may be referred to as a tally.

In some embodiments, such as those described above, storing the first number may also include increasing the number of first binary values in the binary field. In some embodiments, however, the counter value may not increase monotonically; in fact, any desirable sequence of the counter may be implemented via one or more of the portions of memory. In some embodiments, it may also be desirable to alternate or follow some other pattern when assigning, in the example provided above, a '0' in the field of '1's. Such other patterns may provide, for example, a decrease in parasitic wear between bits in a same word line or same bit line in flash memory.

In 404, a second number indicating a second portion of the current number of the counter may be stored in a second portion of the memory. In some embodiments, the circuit logic illustrated in FIG. 3 may perform the storing of the second number.

In some embodiments, the second number may specify the number of times the first number of first binary values has comprised an entirety of the binary field, i.e., the number of times the first number has "rolled over". In the example described above where the first number indicates the number of '0's in a binary field, the second number may specify the number of times the entire field has been programmed to '0's. Said another way, the second number may be the number of times the binary field has been filled. In this example, the first and second numbers specify a counter where the counter is a 2-digit base k number in which the units digit is unary encoded and the k digit is encoded in a desirable base, e.g., binary. In one embodiment, storing the second number may include determining if the number of first binary values comprises an entirety of the binary field, and, upon determining that the first binary values has comprised an entirety of the binary field, updating the second number in response to said determining. In alternate embodiments, the second number may instead indicate how many times a portion of the binary field has been filled with first binary values. Additionally, storing the second number may include setting each member of the binary field to a second binary value in response to said updating. In the example where the first number indicates the number of '0's in a binary field, this setting may be performed by changing each of the '0's in the binary field to '1's using an erase function.

In some embodiments, this number may be binary, i.e., base 2. In alternate embodiments, the second number may be specified as a number of one of the first binary values and second binary values in a second binary field. Said another way, the second number may be a number of binary values in a binary field similar to the tally method described in 402. In various embodiments, the binary values may be the same as those described in 402. Alternatively, the binary values may also be reversed, e.g., if the first number is the number of 'O's in the binary field, the second number may be the number of '1's in the second binary field. Note that the second number is not limited to binary values, both within the field of values and in other embodiments described hereinabove, and in fact, other bases and representations are envisioned. Furthermore, as stated hereinabove with respect to the first number, further patterns for storing the second number are envisioned that may provide desirable effects for the interaction between the counter and the memory.

As mentioned above, FIG. 5 illustrates a specific embodiment of a counter implemented in memory. In this embodiment, a flash block of length n may be divided into two sections: one of length k, which may be used to hold a tally of size k, and another of length n–k, which may be a binary number representing the number of times k has been counted. In the example illustrated, n is 1024 and k is 1000. In this embodiment, the block may first be initialized to all '1's, and subsequently, the counter may be set to a starting value, in this case, 1,000. Thus, the counter is specified by the binary portion comprising a value of '1' in the 1000-1024 bit portion, i.e., '. . . 00001', and the tally portion comprising a value of '0' in the 0-999 bit portion, i.e., '111 . . . 111 . . . 111'. Said another way, the '1' in the binary portion indicates 1,000 and the '0' in the tally portion indicates the amount that should be added, in this case, 1,000 plus 0, or 1,000.

The counter may then increment by programming bits monotonically from bit 0 to bit 999 as illustrated in steps 1-1,000. More specifically, counting occurs in the tally portion by writing one '0' to the entire flash line, shifting left by one bit position for each iteration of the counter. When the line has been written k times, the method continues by erasing the entire line and adding 1 to the binary value by programming the new binary value into bit positions k+1 to n. Counting may then continue by again iteratively writing a sequence of '0's starting in bit position 0. In the example illustrated by FIG. 5, in counting '1,001' and '1,002', the first three bits of the tally portion may be programmed with '110' and '101' respectively, resulting in the value '100' for the three bits and indicating two counts of the counter. When the counter reaches 1,050, the first and second number may specify the current value by a '1' in the binary portion and 50 '0's in the tally portion, thereby indicating 1,000 plus 50, or 1,050. Upon the $1,001^{st}$ step, the entire block may be erased, and the second number may encode a value of '2' in binary, i.e., '. . . 00010', in bits 1000-1024.

Thus, in the embodiment described above, for an n bit counter block, each bit is programmed to '0' only one out of n writes to the block, for a possible n-fold improvement in flash cell lifetimes. The embodiment of FIG. 5 provides a counter that may count to 10,000,000 and still keep within the 10,0000 write cycle limit (i.e., erase/program cycle limit for flash memory). As noted above, using normal counting replication methods, in a NOR flash memory with byte wide blocks, the minimum size of a 32M counter in a 10,000 cycle lifetime may be as high as 3,000 bytes. Using the embodiment illustrated in FIG. 5, the counter may be implemented in a memory with 128 byte blocks with only 384 bytes representing an improvement by nearly a factor of ten. With longer minimum block sizes, the improvement factor may be even greater. Thus, FIG. 5 illustrates a specific embodiment of efficient implementation of a counter in memory.

Thus, the first and second numbers may specify the current number of the counter. As described in numerous of the examples above, storing the first number and the second number a plurality of times may implement a counting function of the counter. Additionally, by utilizing the fact that writing a '1' to an already programmed bit does not cause wear on the cell, the described implementation of a counter may reduce the number of physical bitwise operations applied to the memory, increase the lifetime of the memory, and operate in accordance with the performance requirements of a TPM counter.

Additionally, as indicated hereinabove, further embodiments may include additional portions of memory with associated additional numbers which may specify and implement a counter in memory. In some embodiments, one or more of the first number, the second number, and the additional numbers may specify the current number of the counter. Furthermore, similar to the remarks above regarding the first and second numbers, storing these additional numbers in additional portions of memory may operate to implement a memory-efficient counting function of the counter.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for implementing a counter in a flash memory, the method comprising:
   storing a first number of first binary values in a binary field in a first portion of the flash memory, wherein the first number of first binary values indicates a first portion of a current number of the counter; and
   storing a second number in a second portion of the flash memory, wherein the second number indicates a second portion of the current number of the counter;
   wherein the first number of first binary values and the second number specify the current number of the counter; and
   wherein said storing the first number and said storing the second number are performed a plurality of times to implement a counting function of the counter.

2. The method of claim 1,
   wherein said storing the first number of first binary values in the binary field further comprises:
   increasing the number of first binary values in the binary field.

3. The method of claim 1,
   wherein the second number specifies a number of times the first number of first binary values has comprised an entirety of the binary field.

4. The method of claim 1, wherein said storing the second number further comprises:
   determining if the first number of first binary values comprises an entirety of the binary field; and
   updating the second number if the first number of first binary values comprises the entirety of the binary field in response to said determining.

5. The method of claim 4, the method further comprising:
   setting each member of the binary field to a second binary value in response to said updating.

6. The method of claim 1,
   wherein said storing the first number of first binary values in the binary field operates to reduce a number of operations to the flash memory.

7. The method of claim 1,
   wherein said storing the first number of first binary values in the binary field operates to increase a lifetime of the flash memory.

8. The method of claim 1,
   wherein the second number is a binary number.

9. The method of claim 1,
   wherein the second number is specified as a number of one of the first binary values and second binary values in a second binary field.

10. The method of claim 1,
    wherein said storing the first number comprises storing a number of "0" values in a field of "1" values in a first portion of flash memory, and wherein the number of "0" values indicates a first portion of a number.

11. The method of claim 1,
    wherein the counter implemented in flash memory operates under the performance specifications of a TPM counter.

12. The method of claim 1, the method further comprising:
- storing additional numbers in additional portions of flash memory, wherein one or more of the first number, the second number, and the additional numbers specify the current number of the counter; and
- wherein said storing the first number, said storing the second number, and said storing the additional numbers is performed a plurality of times to implement a counting function of the counter.

13. A system for implementing a counter, comprising:
- a flash memory comprising a first portion and a second portion;
- logic circuitry coupled to the flash memory which stores 1) a first number of first binary values in a binary field in the first portion of the flash memory, wherein the first number of first binary values indicates a first portion of a current number of the counter, and 2) stores a second number in the second portion of the flash memory, wherein the second number indicates a second portion of the current number of the counter;
- wherein the first number of first binary values and the second number specify the current number of the counter;
- wherein the logic circuitry operates to store the first number and the second number in the flash memory a plurality of times to implement a counting function of the counter.

14. The system of claim 13,
- wherein the logic circuitry coupled to the flash memory storing the first number of first binary values in the binary field further comprises:
  - the logic circuitry coupled to the flash memory increasing the number of first binary values in the binary field.

15. The system of claim 13,
- wherein the second number specifies a number of times the first number of first binary values has comprised an entirety of the binary field.

16. A method for implementing a counter in a flash memory, the method comprising:
- counting monotonically by integers by repeatedly storing values in the flash memory, wherein said counting comprises repeatedly performing:
  - storing a first number of first binary values in a binary field in a first portion of flash memory, wherein the first number of first binary values indicates a first portion of a current number of the counter;
  - storing a second number in a second portion of flash memory, wherein the second number indicates a second portion of the current number of the counter;
  - wherein the first number of first binary values and the second number specify the current number of the counter.

17. A computer accessible flash memory medium which implements a counting function, the computer accessible flash memory medium comprising:
- a first portion which stores a first number of first binary values in a binary field, wherein the first number of first binary values indicates a first portion of a current number of the counter;
- a second portion which stores a second number, wherein the second number indicates a second portion of the current number of the counter;
- wherein the first number of first binary values and the second number specify a current number of the counting function;
- wherein the first portion and second portion are operable to repeatedly store the first number and the second number, respectively, a plurality of times to implement the counting function.

18. The memory medium of claim 17,
- wherein repeatedly storing the first number of first binary values in the binary field operates to increase the number of first binary values in the binary field.

19. The memory medium of claim 17,
- wherein the second number specifies a number of times the first number of first binary values has comprised an entirety of the binary field.

20. A method for storing a number in a flash memory, the method comprising:
- storing a first number of first binary values in a binary field in a first portion of the flash memory, wherein the first number of first binary values indicates a first portion of the number; and
- storing a second number in a second portion of the flash memory, wherein the second number indicates a second portion of the number;
- wherein the first number of first binary values and the second number specify the number; and
- wherein said storing the first number and said storing the second number are performed a plurality of times to store a plurality of different numbers in the flash memory.

* * * * *